(12) United States Patent
Chung

(10) Patent No.: US 7,679,982 B2
(45) Date of Patent: Mar. 16, 2010

(54) MULTI-DIE PACKAGED DEVICE

(75) Inventor: Sang Hwa Chung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 235 days.

(21) Appl. No.: 11/760,769

(22) Filed: Jun. 10, 2007

(65) Prior Publication Data
US 2008/0298157 A1    Dec. 4, 2008

(30) Foreign Application Priority Data
Dec. 28, 2006    (KR) ..................... 10-2006-0136371

(51) Int. Cl.
*G11C 5/14* (2006.01)
(52) U.S. Cl. .................. 365/227; 365/229; 365/189.09
(58) Field of Classification Search .................. 365/63, 365/227, 189.011, 51, 229, 189.09
See application file for complete search history.

(56) References Cited

U.S. PATENT DOCUMENTS

| 2003/0112691 | A1* | 6/2003 | Sundaram et al. ........... 365/226 |
| 2005/0125595 | A1* | 6/2005 | Takeuchi et al. ............ 711/103 |
| 2005/0243631 | A1* | 11/2005 | Akiba et al. ................ 365/222 |
| 2008/0013380 | A1* | 1/2008 | Cornwell et al. ....... 365/185.21 |

FOREIGN PATENT DOCUMENTS

| KR | 1020000014072 A | 3/2000 |
| KR | 20060002930 | 1/2006 |

* cited by examiner

*Primary Examiner*—Anh Phung
*Assistant Examiner*—Toan Le
(74) *Attorney, Agent, or Firm*—Townsend and Townsend and Crew LLP

(57) ABSTRACT

A packaged multi die device includes at least one memory die. The one or more of the memory dice includes a memory function circuit configured to program or read data, a logic circuit configured to control the program operation and the read operation of the memory function circuit in accordance with an inputted operation command, and a power supplying circuit configured to provide a power corresponding to an operation mode to the memory function circuit, and apply an extra power to the logic circuit.

7 Claims, 4 Drawing Sheets

MULTI-DIE PACKAGED DEVICE

CROSS-REFERENCE TO RELATED APPLICATIONS

This application claims priority from Korean Patent Application No. 2006-136371, filed on Dec. 28, 2006, the contents of which are incorporated herein by reference in its entirety.

BACKGROUND OF THE INVENTION

The present invention relates to a multi-die package, and more particularly to a multi-die package for reducing the current consumption.

Recently, electronic apparatuses are much leaner and lighter in accordance with the developments of the semiconductor industry and the requirements of a user. One technique for creating leaner and lighter electronics is a multi-chip packaging technique.

The multi-chip packaging technique means a technique for packaging a plurality of semiconductor chips in one package. Here, a method of using the multi-chip package has more advantages than a method of using a plurality of packages which have respectively one semiconductor in view of miniaturization, light weight and packaging area.

Generally, one of the chips in the multi-chip package is selected in response to a selecting signal in its operation. In this case, the chip not selected does not operate during the operation of the selected chip.

FIG. 1 is a block diagram illustrating a common double die package.

In FIG. 1, the double die package where two memory chips are packaged includes a first die or chip 100A and a second chip 100B. Here, the second chip 100B has the same constitution as in the first chip 100A.

The first chip 100A includes a memory circuit 110 and a power supply circuit 130 for supplying power to the memory circuit 110. Here, the memory circuit 110 has a surrounding circuit for operating semiconductor chip and memory cells.

The memory circuit 110 has a memory cell array 111, a X decoder circuit 112, a page buffer circuit 113, a Y decoder circuit 114, a buffer 115, an I/O 116, an address register/counter 117, an operation control and high voltage generating circuit 118, a command interface logic 119, a command register 120 and a data register 121.

The power supply circuit 130 includes a standby power circuit 131, an active power circuit 132, a reference power circuit 136 and a power level sensing circuit 137.

The reference power circuit 136 has a standby mode circuit 134 and an active mode circuit 135.

The second chip 100B has the same constitution as in the first chip 100A.

The first chip 100A and the second chip 100B operate selectively in response to a chip selecting signal CE#. Here, in the case that the chip selecting signal CE# having a low level is transmitted, a corresponding chip operates.

When the chip selecting signal CE# having a low level is transmitted to one of the dice 100A and 100B, a corresponding chip is in an operation mode. However, when the chip selecting signal CE# having a high level is provided to one of the dice 100A and 100B, a corresponding chip operates in a standby mode as a non-select chip.

In the case that the chip selecting signal CE# having a low level is transmitted, circuits which operate using a minimum standby power are converted into main circuits. Then, an active power is applied to the circuits, and so the circuits operate.

In the active mode, the active power circuit 132 provides an active voltage. Additionally, power is applied to the active power circuit 132, the I/O 116, the buffer 115, the address register/counter 117, the command interface logic 119, the command register 120, the data register 121, the X decoder circuit 112 and the Y decoder circuit 114 during data input, and so the circuits 132, 116, 115, 117, 119, 120, 121, 112 and 114 operate.

Moreover, the operation control and high voltage generating circuit 118, the X decoder circuit 112, the page buffer 113 and the Y decoder circuit 114 operate in the above operation condition.

In the standby mode, the standby power circuit 131 provides a standby voltage. In this case, only power level sensing circuit 137 operates to sense a voltage level of the command interface logic 119.

In the case that a chip to which the chip selecting signal CE# having a low level is transmitted operates as mentioned above, chip selecting signals CE# for operating each of the die 100A and 100B are required in the package having the first chip 100A and the second chip 100B as shown in FIG. 1. However, only one chip selecting signal CE# is usually employed in a multi-die package so as to control the operation of the multi-die package.

In the case that the multi-die package operates in accordance with the common chip selecting signal CE#, the active power is also applied to the non-select chip that is not operated. That is, a current is unnecessarily consumed. Accordingly, the multi-die package where the common chip selecting signal CE# is transmitted has an concurrent operation function for operating the non-select chip together when a ready/busy signal R/B# of the chip being operated in accordance with the chip selecting signal CE# is converted into a low level, i.e. the chip is busy.

FIG. 2 is a timing diagram illustrating an operation of the multi-die package in FIG. 1.

FIG. 2 shows the operation of the multi-die package having the concurrent operation function in FIG. 1. In particular, FIG. 2 illustrates an operation timing diagram 210 of the first chip 100A and an operation timing diagram 220 of the second chip 100B.

Referring to FIG. 2, the chip selecting signal CE# is simultaneously transmitted to the dice 100A and 100B, and so the first chip 100A starts to operate. Then, in the case that the ready busy signal R/B# of the first chip 100A is converted into a low level, the second chip 100B should operate.

In other words, in the case that an operation command is provided to the second chip 100B during the ready busy signal R/B#=low of the first chip 100A, the second chip 100B senses the operation command, and then the second chip 100B operates in response to the operation command. In particular, in the first chip 100A selected to be operated, the active power circuit 132, the active mode circuit of the reference power circuit 136 and the power level sensing circuit 137 operate in accordance with the active mode. Whereas, in the standby mode, the standby power circuit 131, the standby mode circuit 134 of the reference power circuit 136 and the power level sensing circuit 137 in the first chip 100A operate.

The non-select second chip 100B which did not operate receives the operation command during the ready busy signal R/B#=low of the first chip 10A.

However, since the power is not applied to the address register/counter 117, the command interface logic 119, the command register 120 and the data register 121 which senses the operation command, a problem that the operation command is not sensed may occur.

SUMMARY OF THE INVENTION

The present invention relates to a multi-die package for controlling an operation power of a multi-die package so that a current is not unnecessarily consumed, and operating efficiently the multi-die.

A multi-die packaged device according to one example embodiment of the present invention has at least one memory chip. Here, one or more of the memory die includes a memory function circuit configured to program or read data, a logic circuit configured to control the program operation and the read operation of the memory function circuit in accordance with an inputted operation command, and a power supplying circuit configured to provide a power corresponding to an operation mode to the memory function circuit, and apply an extra power to the logic circuit.

The memory function circuit includes a memory cell array configured to have a plurality of memory cells for storing data; an X decoder circuit and an Y decoder circuit configured to select a memory cell in the memory cell array in accordance with an address transmitted from the logic circuit; a page buffer configured to program data to the memory cell selected by the X decoder circuit and the Y decoder circuit, or read data from the selected memory cell.

The logic circuit includes an address register/counter configured to control an address related to the program operation or the read operation of data; a command interface logic configured to control the memory function circuit in accordance with the inputted operation command; a command register configured to store temporarily information concerning the operation command provided to the command interface logic; and a data register configured to store temporarily data inputted for data program.

The power supplying circuit includes an active power circuit configured to provide a power corresponding to the program operation or the read operation in an active mode; a standby power circuit configured to provide a power in a standby mode; a logic providing circuit configured to provide a power to the logic circuit; and a reference voltage providing circuit configured to provide a reference voltage for operating the active power circuit, the standby power circuit and the memory chip.

In the packaged device, a chip selecting signal is transmitted to the memory die.

The packaged device has a concurrent operation function for operating one of the die when the other chip has a ready busy state.

A multi-die packaged device according to another example embodiment of the present invention at least one memory chip. Here, a first power corresponding to an operation mode is applied to a first memory chip selected for a program operation or a read operation of the memory die, and a second power is provided to a logic circuit for operation control in a second memory chip not selected so that the second memory chip senses an operation command.

As described above, the packaged device of the present embodiment supplies independently a first power to a logic part for operation control when a second power is applied to a memory device having at least one chip, and so a chip not selected may also operate without an error in accordance with an operation command in a concurrent operation function. Here, the die or chips are packaged in the memory device.

DESCRIPTION OF SPECIFIC EMBODIMENTS

Hereinafter, the embodiments of the present invention will be explained in more detail with reference to the accompanying drawings.

Figure 1:
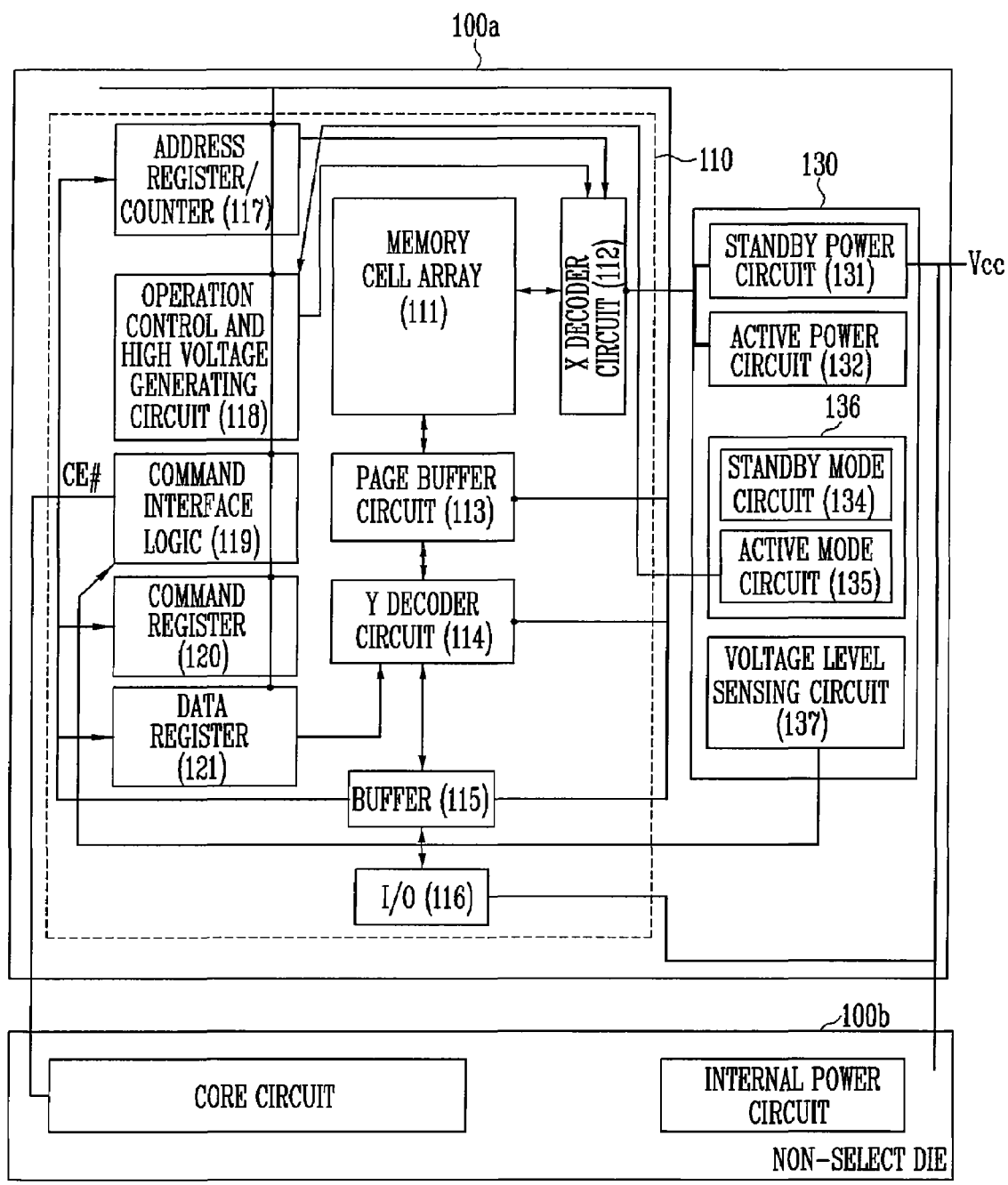
FIG. 1 is a block diagram illustrating a common double die package.
Figure 2:
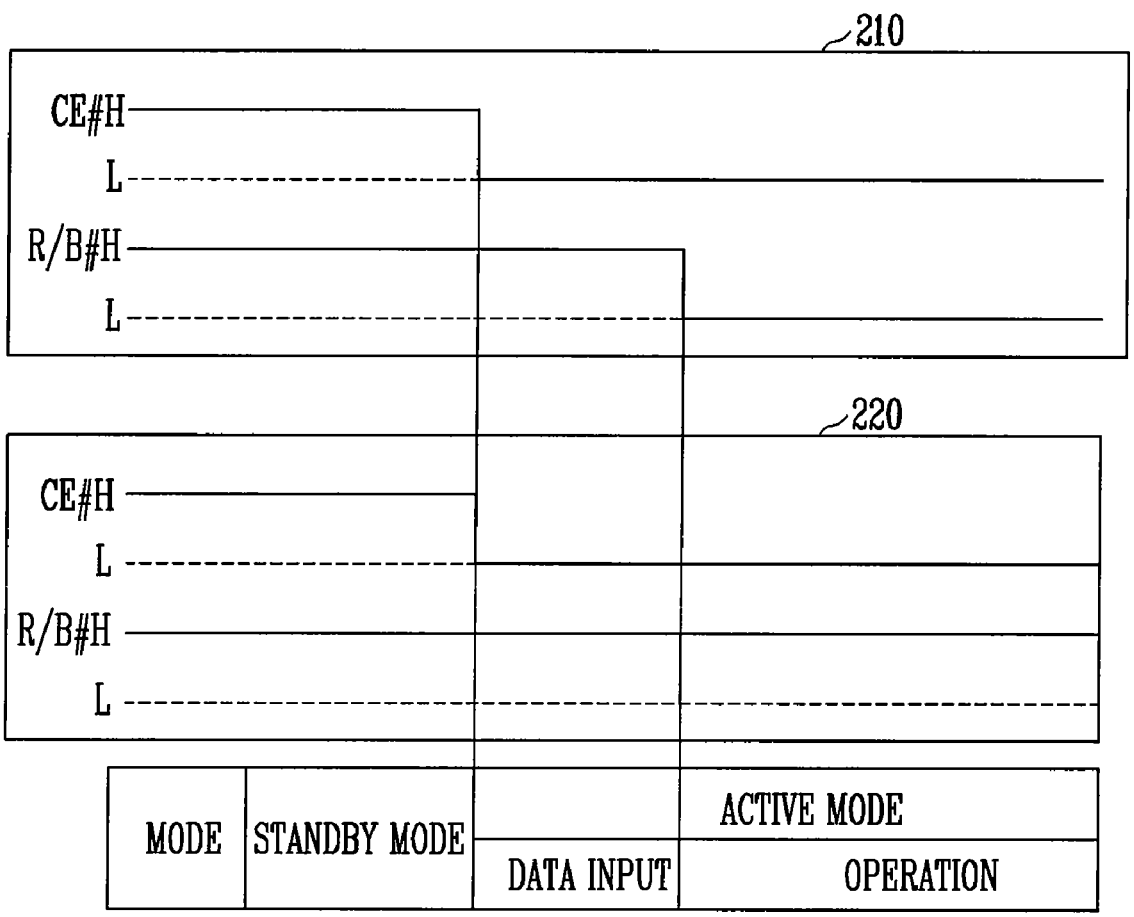
FIG. 2 is a timing diagram illustrating an operation of the multi-die package in FIG. 1.
Figure 3:
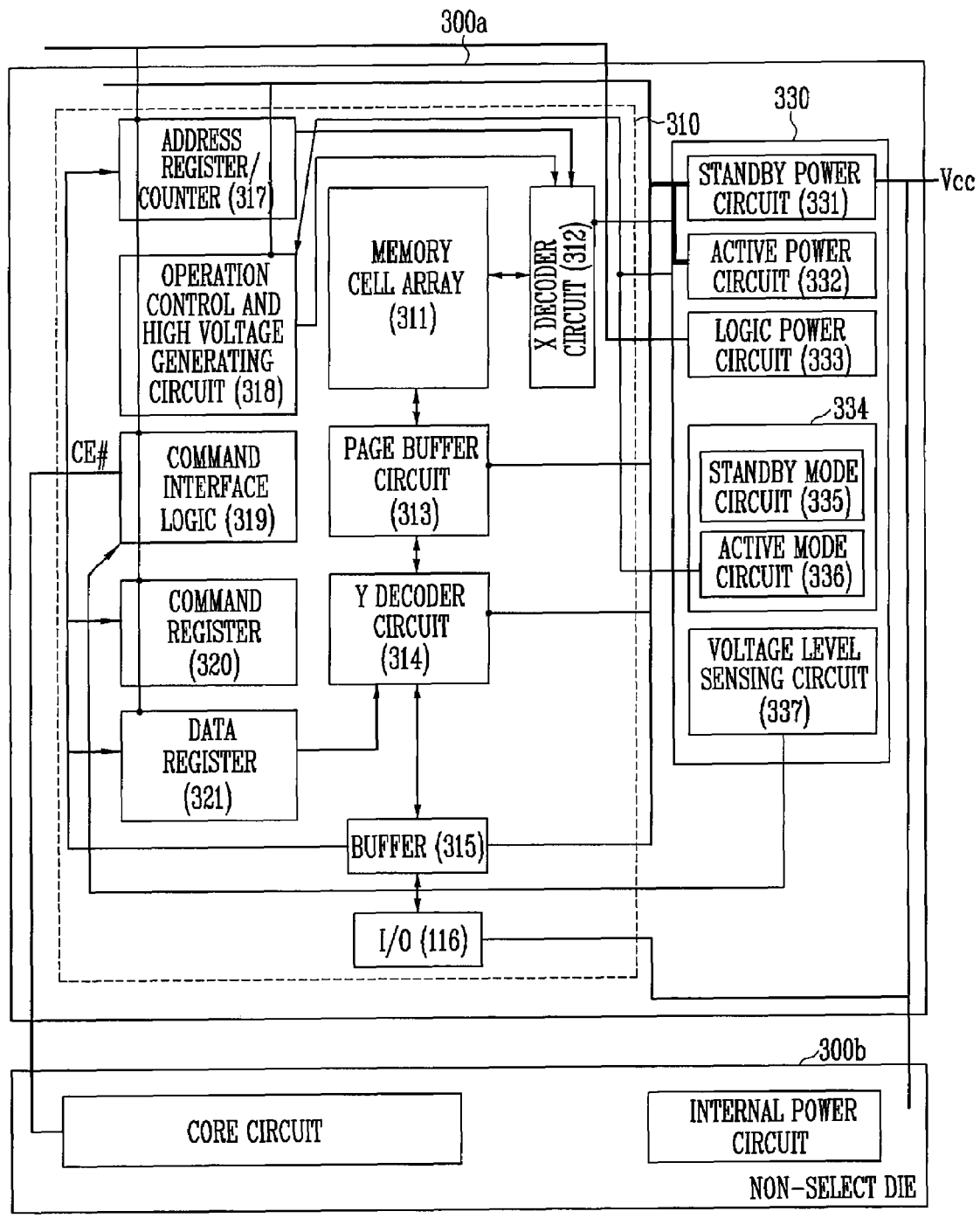
FIG. 3 is a block diagram illustrating a double die package according to one example embodiment of the present invention.

In FIG. 3, the double die package of the present embodiment includes a first die 300A and a second die 300B.

The first die 300A has a memory circuit 310 and a power supply circuit 330.

The second die 300B has the same constitution as in the first die 300A.

The memory circuit 310 includes a memory cell array 311 having memory cells for storing data, a X decoder circuit 312 and a Y decoder circuit 314 for selecting a word line of the memory cell array 311 in accordance with an address signal, a page buffer circuit 313 having page buffers which are coupled to a pair of bit lines of bit lines related to the memory cell array 311 and program and read data, an address register/counter 317 for controlling an address in a program operation or a read operation, an operation control and high voltage generating circuit 318 for providing a voltage for an operation, a command interface logic 319 for performing an internal command such as a chip enable, etc, a command register 320 for command performance, a data register 321 for storing temporarily program data, a buffer 315 for storing temporarily input/output data, and an I/O 316 for outputting data to an outside apparatus (not shown) or receiving data from an outside apparatus.

The power supplying circuit 330 includes a standby power circuit 331 for providing a power in a standby mode, an active power circuit 332 for providing a power in an active mode, a logic power circuit 333 for providing an extra power to a logic, a reference power circuit 334 for providing a reference voltage in the standby mode and the active mode, and a power level sensing circuit 337 for sensing a level of the power.

The reference power circuit 334 has a standby mode circuit 335 for providing a first reference voltage in the standby mode, and an active mode circuit 336 for providing a second reference voltage in the active mode.

The memory cell array 311, the X decoder circuit 312, the page buffer circuit 313 and the Y decoder circuit 314 in the memory circuit 310 perform a memory function for programming and reading data.

The address register/counter 317, the command interface logic 319, the command register 320 and the data register 321 verifies an operation command inputted from an outside apparatus (not shown), and performs the memory function in accordance with the verification result. That is, the address register/counter 317, the command interface logic 319, the command register 320 and the data register 321 are a logic part for controlling the memory circuit 310 so that the memory circuit 310 operates normally.

The standby power circuit 331 and the active power circuit 332 provide a power to the memory cell array 311, the X decoder circuit 312, the page buffer circuit 313, the Y decoder circuit 314, the buffer 315 and the I/O 316. In addition, the standby power circuit 331 and the active power circuit 332 provide a power corresponding to an operation mode to the operation control and high voltage generating circuit 318.

The address register/counter 317, the command interface logic 319, the command register 320 and the data register 321 receive independently a power from the logic power circuit 333 irrespective of the operation mode.

The first and second dice 300A and 300B are selected when a chip selecting signal CE# having a low level is transmitted. In this case, the first die 300A selected for operation receives an active power from the active power circuit 332, and then operates in the active mode.

The second die 300B not selected operates in the standby mode, and receives a standby power from the standby power circuit 332.

Additionally, the logic power circuit 333 applies power to the memory logic circuits, i.e. circuits 317, 319, 320 and 321 which sense the operation command irrespective of the active mode or the standby mode and start to operate in accordance with the sense of the operation command.

Accordingly, the second die 300B as a non-select die converts from the standby mode into the active mode in the case that the operation command is inputted during a ready busy signal R/B#=low of the first die 300A, and then operates. In this case, since the logic power circuit 333 applies a power to the address register/counter 317, the command interface logic 319, the command register 320 and the data register 321, the second die 300B may operate normally in response to the inputted operation command.

Figure 4:
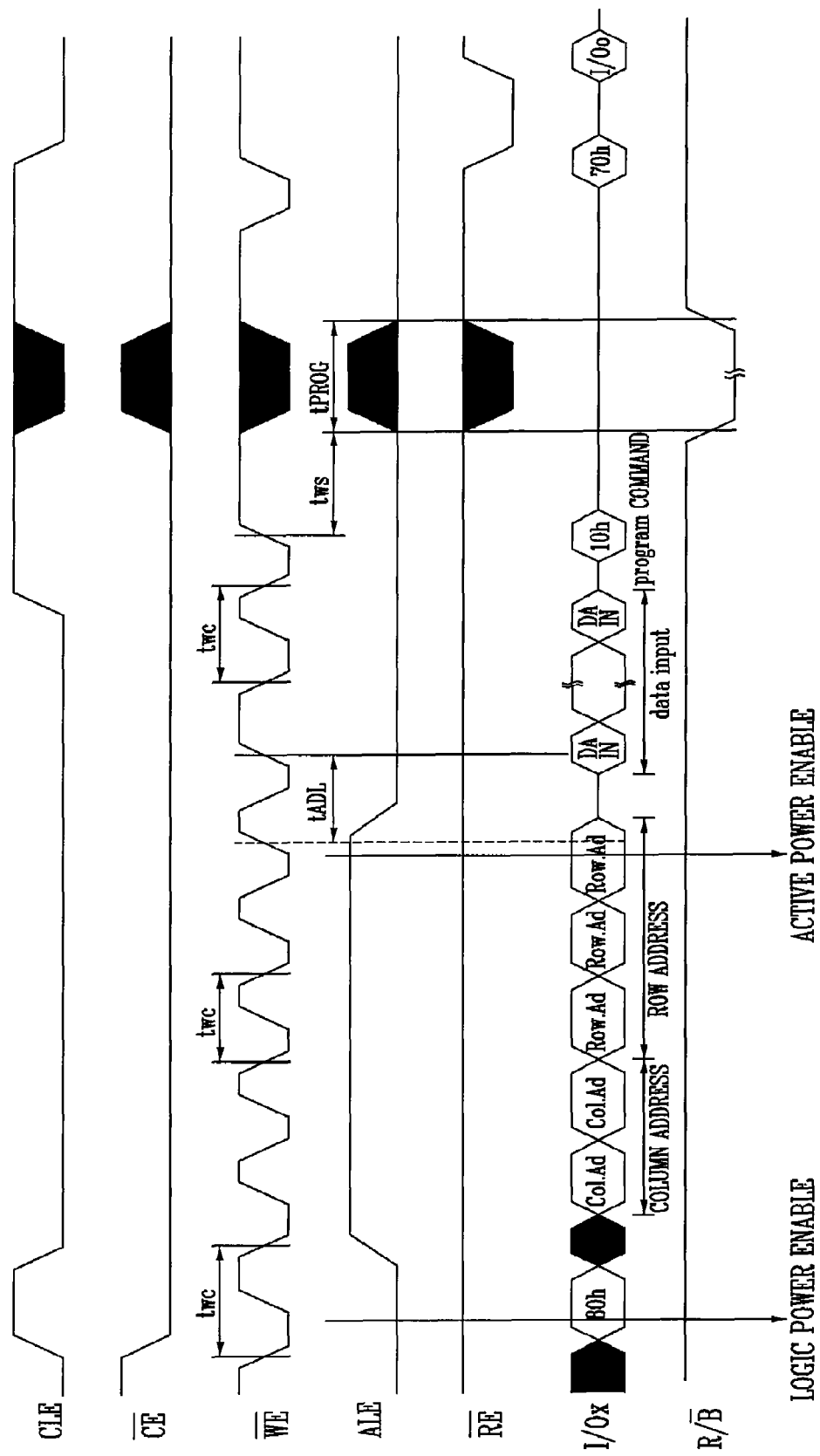
FIG. 4 is a timing diagram illustrating an operation of the multi-die package in FIG. 3.

FIG. 4 shows an operation of the multi-die package when the second die 300B receives a program command. Here, the logic power circuit 333 supplies the power to the above logic circuits during the operation of the first die 300A in the active mode.

In addition, the active power circuit 331 operates when the program command and an address are inputted. As a result, the dice 300A and 300B operate in the active mode.

In brief, the extra power is applied to the logic circuits for operating by verifying the operation command though the multi-die package having at least one die has the concurrent operation command. As a result, the second die 300B not selected may directly operate in response to the operation command under the control of the logic. In this case, since the extra power is applied to only the logic circuits, power can be conserved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A multi-die packaged device comprising:
   at least one memory die,
   wherein the memory die includes:
     a memory function circuit configured to program or read data;
     a logic circuit configured to control the program operation and the read operation of the memory function circuit in accordance with an inputted operation command;
     a power circuit configured to provide a first power to the memory function circuit according to an operation mode;
     a reference voltage providing circuit configured to provide a reference voltage for operating the power circuit; and
     a logic power circuit configured to provide a second power to the logic circuit in a standby mode and an active mode so that the logic circuit senses an operation command during the standby mode.

2. The packaged device of claim 1, wherein the memory function circuit includes:
   a memory cell array including a plurality of memory cells for storing data;
   an X decoder circuit and a Y decoder circuit configured to select a memory cell in the memory cell array in accordance with an address transmitted by the logic circuit; and
   a page buffer configured to program data to the memory cell selected by the X decoder circuit and the Y decoder circuit, or read data from the selected memory cell,
   wherein the packaged device includes at least another memory die having substantially the same configuration as the at least one memory die.

3. The packaged device of claim 2, wherein the logic circuit includes:
   an address register/counter configured to control an address related to the program operation or the read operation of data;
   a command interface logic configured to control the memory function circuit in accordance with the inputted operation command;
   a command register configured to store temporarily information concerning the operation command provided to the command interface logic; and
   a data register configured to store temporarily data to be programmed.

4. The packaged device of claim 1, wherein the power circuit includes:
   an active power circuit configured to provide power corresponding to the program operation or the read operation in an active mode; and
   a standby power circuit configured to provide power in a standby mode.

5. The packaged device of claim 1, wherein a chip selecting signal is transmitted to the memory die.

6. The packaged device of claim 1, further comprising at least another memory die, wherein, when a concurrent operation function is enabled, one memory die is operational when another memory die is in a ready-busy state.

7. A packaged multi-die device comprising:
   first and second memory dice,
   wherein a first power corresponding to an operation mode is applied to the first memory die selected for a program operation or a read operation of the memory dice, and
   wherein a second power is provided to a logic circuit for operation control in the second memory die that is not selected, so that the logic circuit of the second memory die senses an operation command during a standby mode.

* * * * *